US010607902B2

(12) United States Patent
Boone et al.

(10) Patent No.: US 10,607,902 B2
(45) Date of Patent: Mar. 31, 2020

(54) METHOD FOR MEASURING PROXIMITY EFFECT ON HIGH DENSITY MAGNETIC TUNNEL JUNCTION DEVICES IN A MAGNETIC RANDOM ACCESS MEMORY DEVICE

(71) Applicant: Spin Memory, Inc., Fremont, CA (US)

(72) Inventors: Thomas D. Boone, San Carlos, CA (US); Pradeep Manandhar, Fremont, CA (US)

(73) Assignee: SPIN MEMORY, INC., Fremont, CA (US)

( * ) Notice: Subject to any disclaimer, the term of this patent is extended or adjusted under 35 U.S.C. 154(b) by 95 days.

(21) Appl. No.: 15/859,465

(22) Filed: Dec. 30, 2017

(65) Prior Publication Data

US 2019/0206749 A1 Jul. 4, 2019

(51) Int. Cl.
| | | |
|---|---|---|
| H01L 21/66 | (2006.01) | |
| H01L 21/027 | (2006.01) | |
| H01L 21/768 | (2006.01) | |
| H01L 43/08 | (2006.01) | |
| G11C 11/16 | (2006.01) | |
| H01L 43/02 | (2006.01) | |
| H01L 27/22 | (2006.01) | |
| H01F 10/32 | (2006.01) | |
| G11C 29/08 | (2006.01) | |
| H01F 41/34 | (2006.01) | |
| H01L 43/12 | (2006.01) | |

(Continued)

(52) U.S. Cl.
CPC ............ *H01L 22/34* (2013.01); *G11C 11/161* (2013.01); *G11C 29/04* (2013.01); *G11C 29/08* (2013.01); *H01F 10/329* (2013.01); *H01F 10/3254* (2013.01); *H01F 10/3272* (2013.01); *H01F 10/3286* (2013.01); *H01F 41/34* (2013.01); *H01L 21/0277* (2013.01); *H01L 21/76877* (2013.01); *H01L 27/222* (2013.01); *H01L 43/02* (2013.01); *H01L 43/08* (2013.01); *H01L 43/12* (2013.01); *G11C 11/1675* (2013.01); *G11C 2029/0403* (2013.01); *G11C 2029/5602* (2013.01); *H01L 43/10* (2013.01)

(58) Field of Classification Search
CPC ......... H01L 43/08; H01L 43/12; H01L 43/02; H01L 27/228; H01L 43/10
See application file for complete search history.

(56) References Cited

U.S. PATENT DOCUMENTS

| | | | | |
|---|---|---|---|---|
| 2011/0076784 A1* | 3/2011 | Druist | ................... | H01L 27/228 438/3 |
| 2016/0315249 A1* | 10/2016 | Kardasz | ................ | G11C 11/161 |

* cited by examiner

*Primary Examiner* — Tony Tran
(74) *Attorney, Agent, or Firm* — Zilka-Kotab, P.C.

(57) ABSTRACT

A method for testing individual memory elements or sets of memory elements of an array of magnetic memory elements. The method involves forming a mask such as photoresist mask over an array memory elements. The mask is configured with an opening over each of the selected memory elements to be tested. The mask can be formed of photoresist which can be patterned by focused electron beam exposure to form opening at features sizes smaller than those available using standard photolithographic processes. An electrically conductive material is deposited over the mask and into the openings in the mask to make electrical contact with the selected memory element or memory elements to be tested. Then, electrical connection can be made with the electrically conductive material to test the selected one or more magnetic memory elements.

15 Claims, 11 Drawing Sheets

(51) Int. Cl.
*G11C 29/04* (2006.01)
*H01L 43/10* (2006.01)
*G11C 29/56* (2006.01)

METHOD FOR MEASURING PROXIMITY EFFECT ON HIGH DENSITY MAGNETIC TUNNEL JUNCTION DEVICES IN A MAGNETIC RANDOM ACCESS MEMORY DEVICE

FIELD OF THE INVENTION

The present invention relates to magnetic random access memory (MRAM) and more particularly to a method for testing individual memory elements in a high density Magnetic Random Access Memory (MRAM) device.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to the plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for testing one or more magnetic memory elements of a magnetic memory element array. An array of magnetic memory elements can be formed with memory elements being embedded in an electrically insulating material and each having an end that is exposed through the electrically insulating material. A layer of photoresist is deposited over the array of magnetic memory elements. The photoresist is patterned to form it with one or more openings located over one or more of the magnetic memory elements. An electrically conductive material is deposited over the patterned photoresist and into the openings in the patterned photoresist.

The electrically conductive material can then easily be electrically connected with circuitry for testing the individual selected magnetic memory elements. The large area of the electrically conductive material makes contact easy, whereas trying to make individual contact with individual magnetic elements directly would not be feasible. The magnetic memory elements can be formed on a substrate having circuitry such as CMOS circuitry embedded therein. The circuitry connected with the electrically conductive material to test the magnetic memory elements can electrically communicate with the circuitry of the substrate to assist with performing the testing of the selected memory elements.

The photoresist can be patterned using focused electron beam exposure, which advantageously allows the photoresist to be patterned to feature sizes smaller than those possible using standard photolithographic processes. The use of focused electron beam exposure also allows the formation different mask configurations to test different sets of magnetic memory elements without the expense and complexity of manufacturing a different photolithographic mask (photo mask) for each test.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
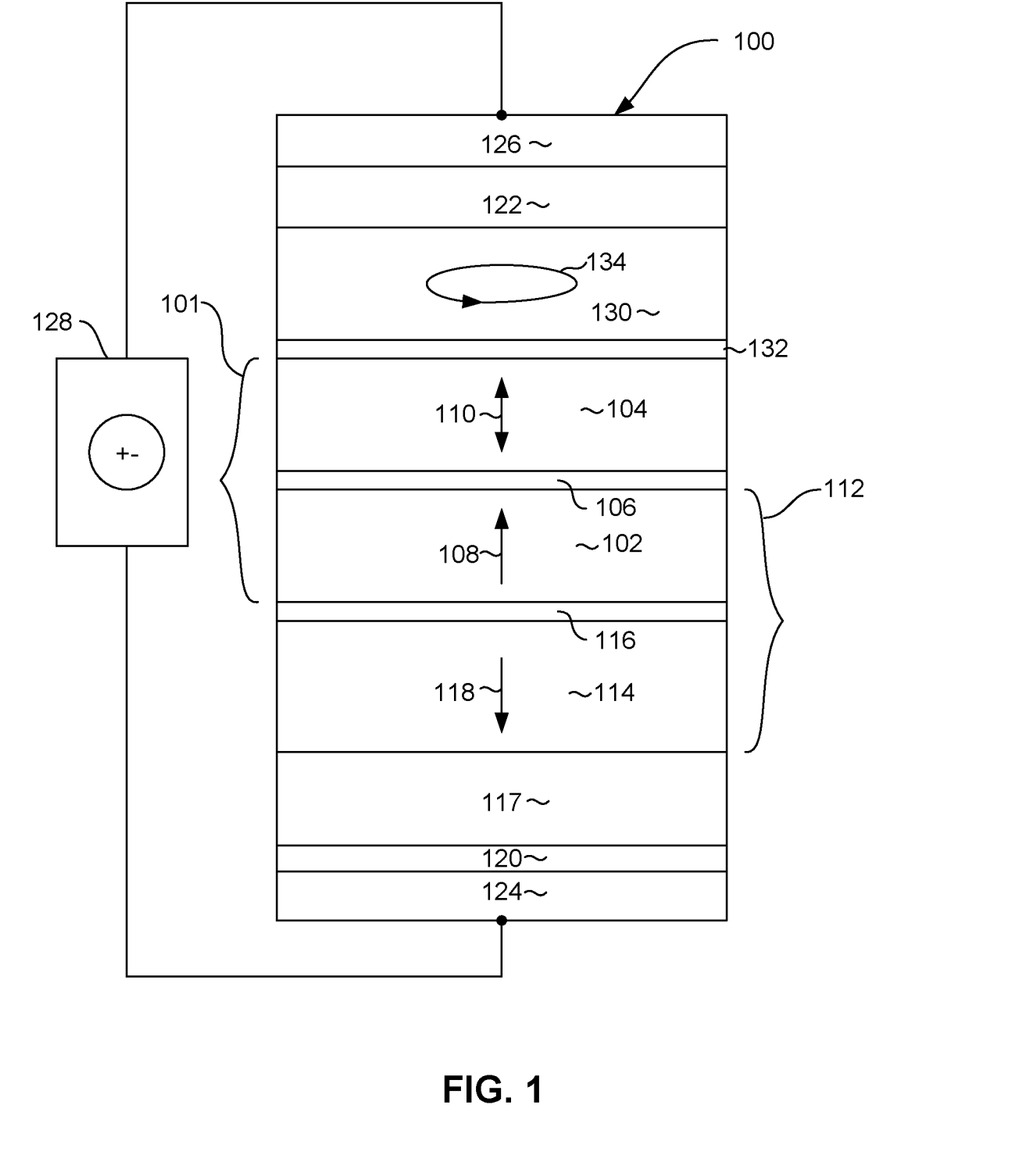
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. Optionally, the keeper layer 114 can be exchange coupled with a layer of antiferromagnetic material such as IrMn 117.

Exchange coupling between the layer of antiferromagnetic material 117 and the keeper layer 114 strongly pins the magnetization 118 of the keeper layer in a first direction. The antiparallel coupling between the layers 114, 102 pins the magnetization 108 of the reference layer 102 in a second direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in an upward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons will not be able to pass through the barrier layer 106. As a result, the electrons (which have been spin polarized by the magnetization 110 of the free layer 104, will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
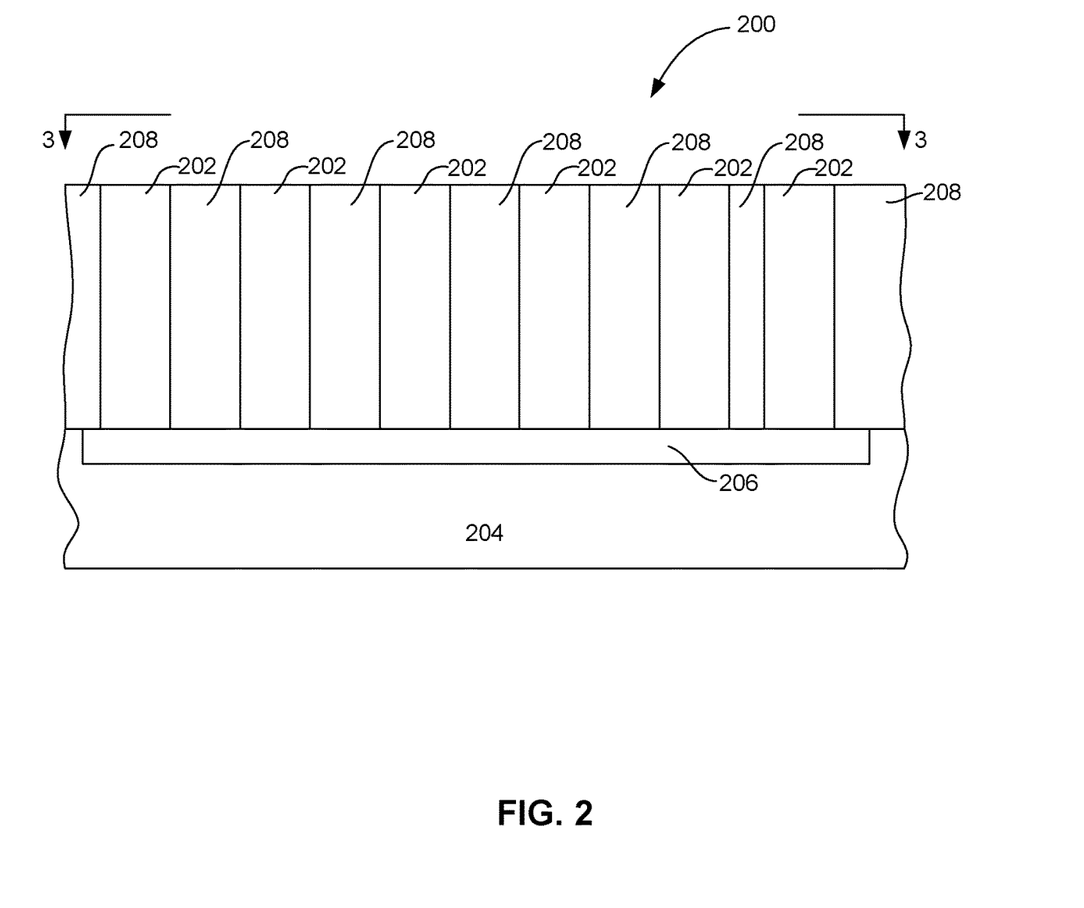
FIG. 2 is a side, cross-sectional view of a magnetic random access memory structure having multiple magnetic memory elements.

FIG. 2 shows a side, cross-sectional view of a Magnetic Random Access Memory structure 200 that includes an array of magnetic memory elements 202. The memory elements 202 are formed on a substrate 204 that includes circuitry 206, such as CMOS circuitry, which can be embedded and formed in the substrate 204. Each of the magnetic memory elements 202 can be surrounded at their sides by an electrically insulating protective fill layer 208, such as SiO$_2$ or alumina.

Each of the magnetic memory elements 202 can be a magnetic tunnel junction structure, such as the memory element 100 described above with reference to FIG. 1. However, this is by way of example, and the detailed structure and features of the memory elements can vary from that of the memory element 100 of FIG. 1. Each of the memory elements 202 is electrically connected at its bottom end with the circuitry (e.g. CMOS circuitry 206, and the top of each memory element 202 is configured to make electrical connection with one or more lead lines (not shown in FIG. 2). These electrical connections allow a current to be supplied to the memory elements to write data to each of the memory elements 202 and also to measure the electrical resistance across the memory elements 202 to read data from the memory elements 202 as described above with reference to FIG. 1.

Figure 3:
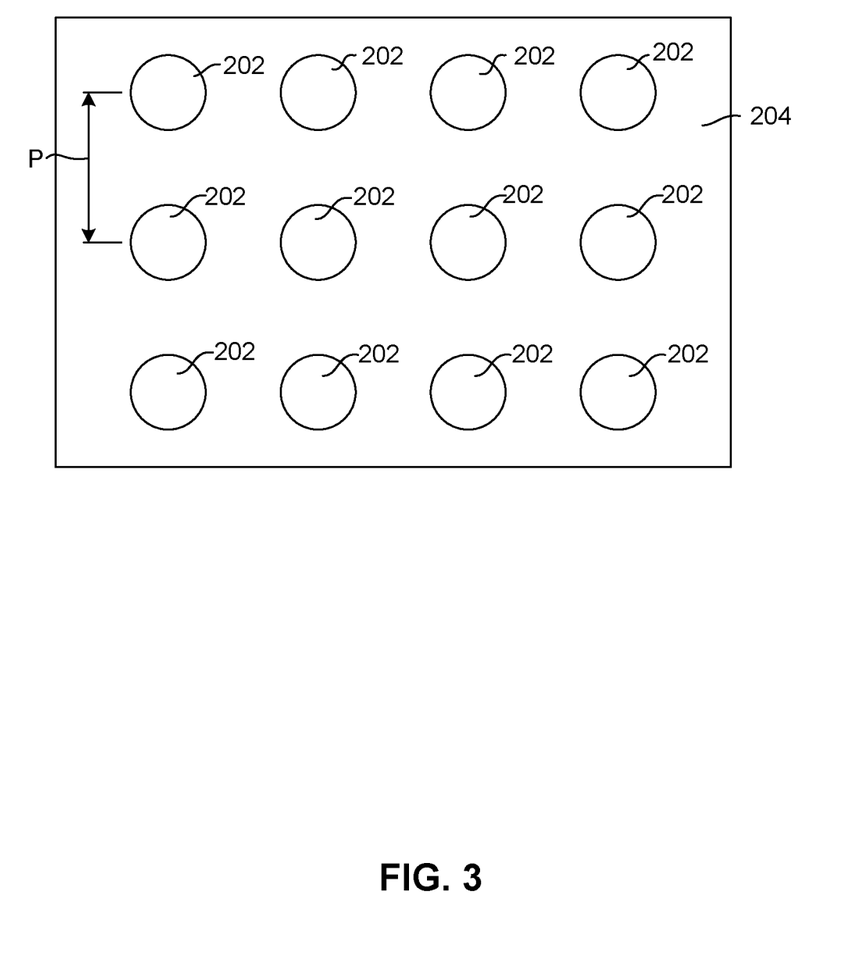
FIG. 3 is a top down view of the magnetic random access memory structure as seen from line 3-3 of FIG. 2.

In order to maximize data density, it is desirable to make the features of the magnetic memory elements 202 and spacing between the memory elements 202 (also referred to as "pitch" indicated by the distance P in FIG. 3) as small as possible in order to maximize the number of memory elements in a given area on a memory chip. However, as the spacing between individual memory elements 202 becomes very small, there is the possibility that magnetic interaction between the memory elements can cause interference between the memory elements 202. This possible interference between memory elements is unpredictable and its effects on memory performance cannot be clearly understood without actually testing individual selected memory elements, such as testing two adjacent memory elements to determine their performance and affect on one another.

However, at very high density, conventional testing, such as using the embedded circuitry or using probing tooling is not practical or possible. Also, the density of the memory elements has reached the point where feature sizes are smaller than the resolution of available photolithographic tooling.

The present invention provides a mechanism for testing any selected number of individual memory elements, even at extremely high density. What's more, this method for testing individual selected memory elements 202 can be performed without any need to change the underlying CMOS circuitry 206, and with only minimal additional processing steps. Therefore, the method for testing individual memory elements 202 such as to determine proximity effect results in minimal additional manufacturing cost or complexity.

Figure 4:
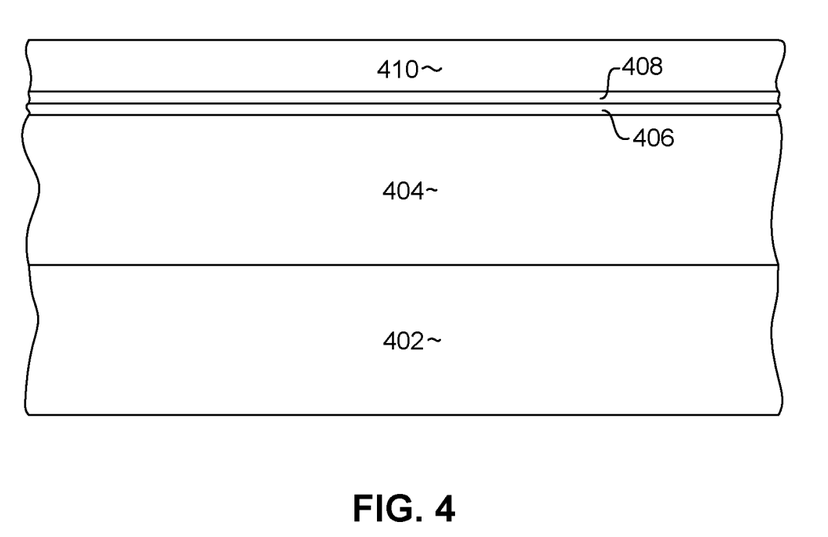
FIGS. 4-7 are views of a magnetic random access memory structure in various intermediate stages of manufacture, illustrating a method for manufacturing a magnetic random access memory structure.

FIGS. 4-7, illustrate a method for manufacturing high density magnetic elements on a substrate prior to testing the memory elements for proximity effect. With reference to FIG. 4, a substrate 402 is provided. The substrate can be a wafer such as a silicon wafer and can have previously described circuitry such as CMOS circuitry (not shown) embedded therein. A layer of magnetic memory element material 404 is deposited over the substrate 402. Although shown as a single layer in FIG. 4 for purposes of simplicity, it should be understood that the layer 404 actually would include various layers used to make a magnetic memory element, such as the memory element 100 described above with reference to FIG. 1, or some other type of memory element structure. A layer of hard mask material 406 can be deposited over the memory element material 404 and a layer of anti-reflective material 408 can be deposited over the hard mask layer 406. The hard mask material 406 can be a material such as SiN, or some other suitable material, and the layer of anti-reflective material 408 can be a bottom anti-reflective coating (BARC) or some other suitable anti-reflective coating. A layer of photoresist material such as a spin on glass photoresist 410 is then deposited over the anti-reflective coating 408.

Figure 5:
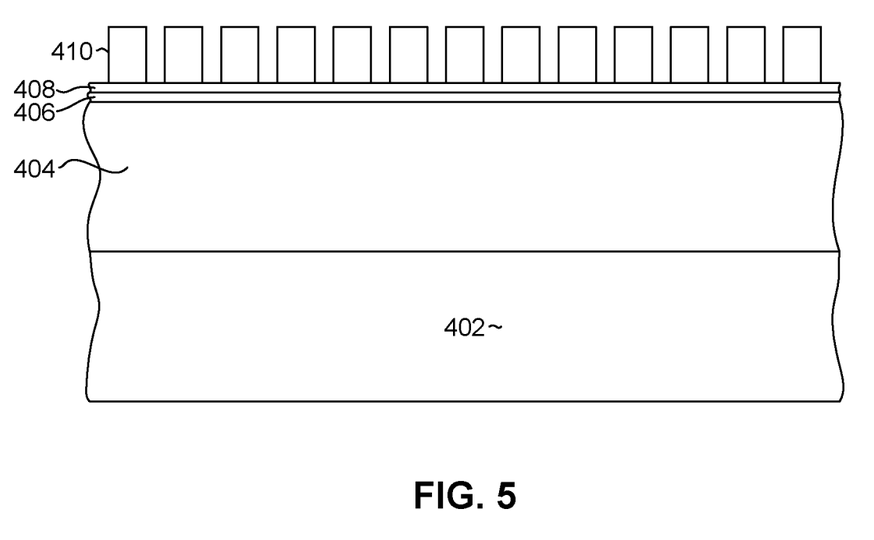

A photolithographic process or focused electron beam (e-beam) process can be used to pattern the photoresist 410, resulting in photoresist mask structure 410 such as that shown in FIG. 5. In this case, the photoresist mask 410 is formed to leave mask material in the areas where the magnetic elements are to be formed. Therefore, the photoresist mask 410 can be formed as an array of cylinders of patterned photoresist (shown in side cross-section in FIG. 5).

Figure 6:
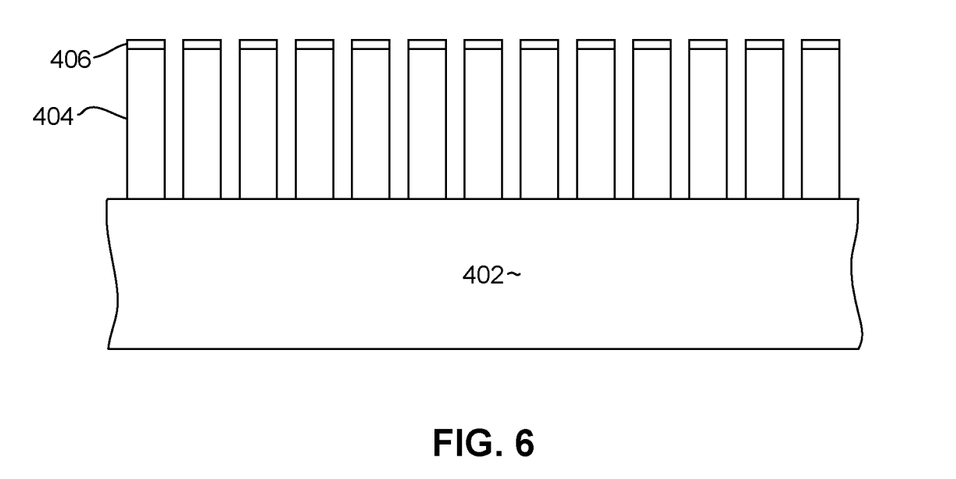

A series of material removal processes such as a combination of reactive ion etching and ion milling can then be performed to transfer the image of the photoresist mask 410 onto the underlying hard mask 406, and another material removal process such as ion milling is performed to remove portions of the magnetic element material 404 that are not protected by the patterned hard mask, leaving a structure as shown in FIG. 6. The material removal process (e.g. ion milling) used to define the individual magnetic memory elements may remove all of photoresist mask 410 (FIG. 5), but the patterned hard mask 406 will remain substantially intact.

Figure 7:
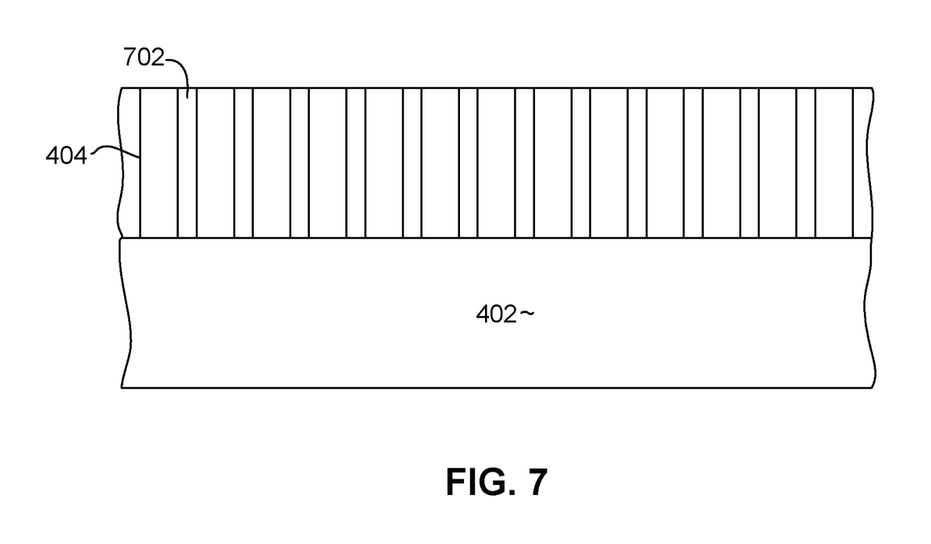

With reference now to FIG. 7, an electrically insulating fill layer such as SiO$_2$ or alumina (Al$_2$O$_3$) is deposited and a planarization process such as chemical mechanical polishing (CMP) can be performed to form a planar surface. The hard mask 408 (FIG. 6) can protect the memory element material during the CMP process. A quick etching such as reactive ion etching can be performed to remove any remaining hard mask, leaving a structure as shown in FIG. 7.

Figure 8:
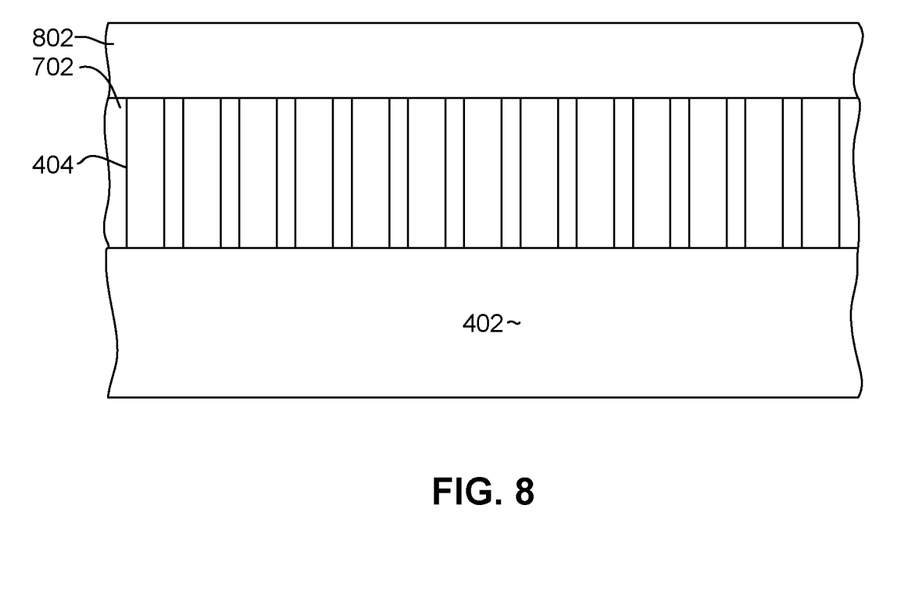
FIG. 8-11 are views of a magnetic random access memory structure with a mask and electrically conductive layer formation, illustrating a method for testing selected magnetic memory elements of a magnetic random access memory array.

At this point in the build process it is desirable to test selected individual memory elements 404 for performance and proximity interference between magnetic elements prior to building additional structure over the memory elements 404. FIGS. 8-11, illustrate a process for achieving this without any need to modify the underlying CMOS electronics circuitry. With reference to FIG. 8, a layer of photoresist 802 is deposited over the memory elements and insulation layer. The photoresist can be a spin-on glass type photoresist.

Figure 9:
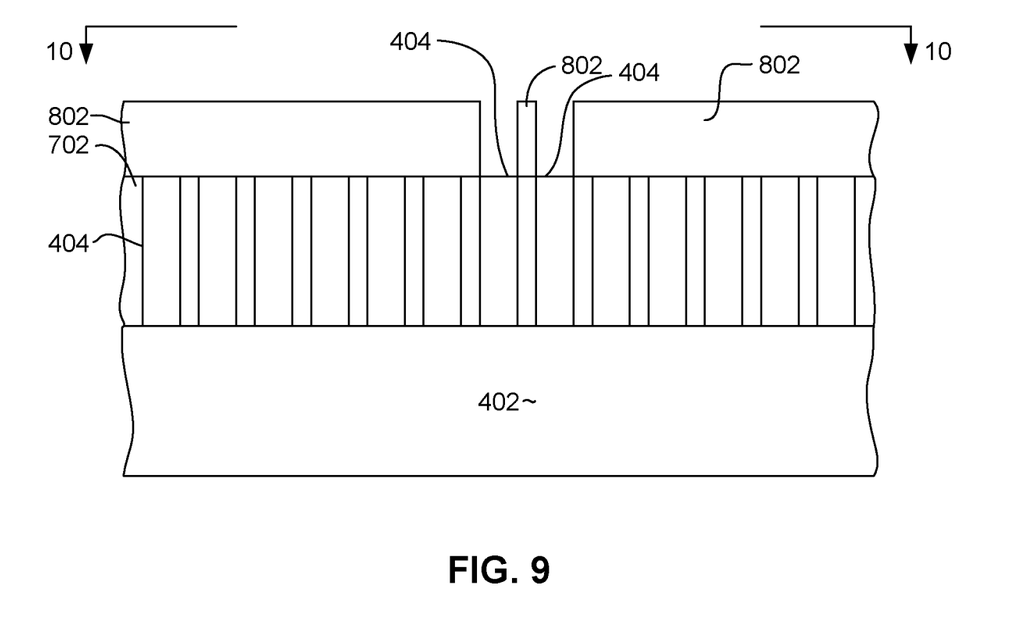
Figure 10:
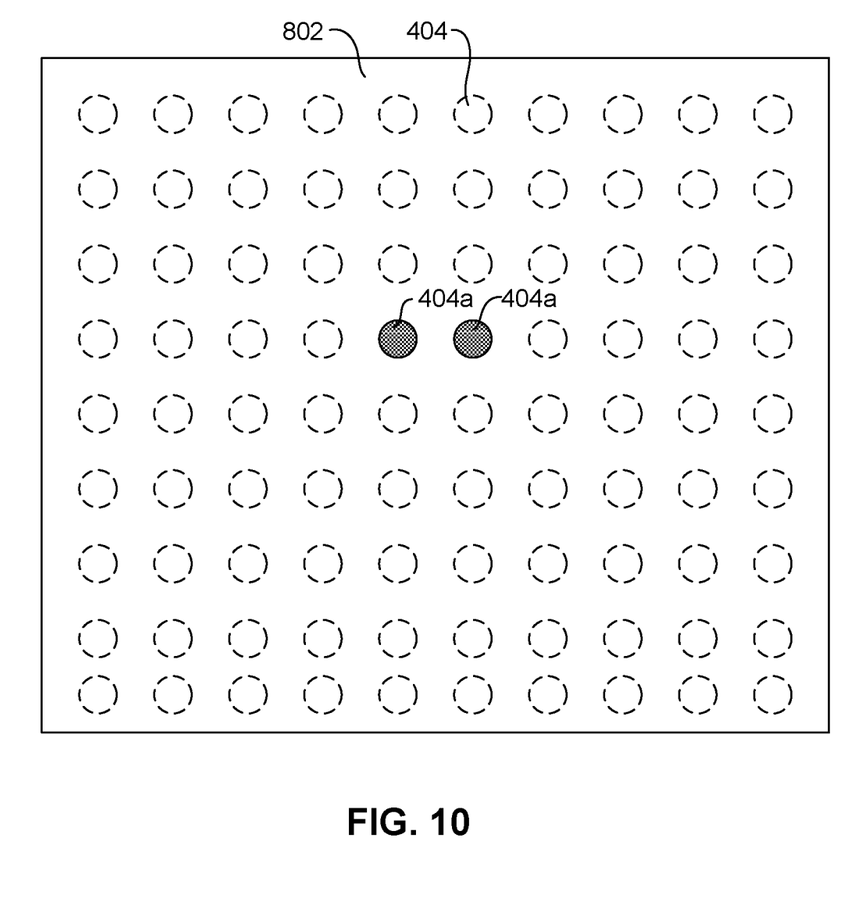

Then, with reference to FIGS. 9 and 10, the photoresist 802 is patterned to remove photoresist material 802 only over the selected memory elements 404 for which testing is desired, thereby opening up and exposing the tops of those selected memory elements 404. This patterning of the photoresist can advantageously be performed using focused electron beam exposure. The use of e-beam exposure (e-beam) exposure allows various different configurations of memory elements to be tested without the need or expense of creating a separate photolithography mask for each testing configuration. In addition, the use of e-beam exposure can be used to open up mask features that are smaller than the resolution limits of currently available photolithographic tooling. This allows the testing of high density magnetic element arrays which would not be possible using standard photolithography, while also providing lower expense and greater flexibility. FIG. 10 shows a top down view as seen from line 10-10 of FIG. 9. In FIG. 10, the memory elements 404 that are hidden beneath the photoresist mask are shown in dashed line. The selected opened up, exposed memory elements are indicated in shaded regions denoted as 404a in FIG. 10.

Figure 11:
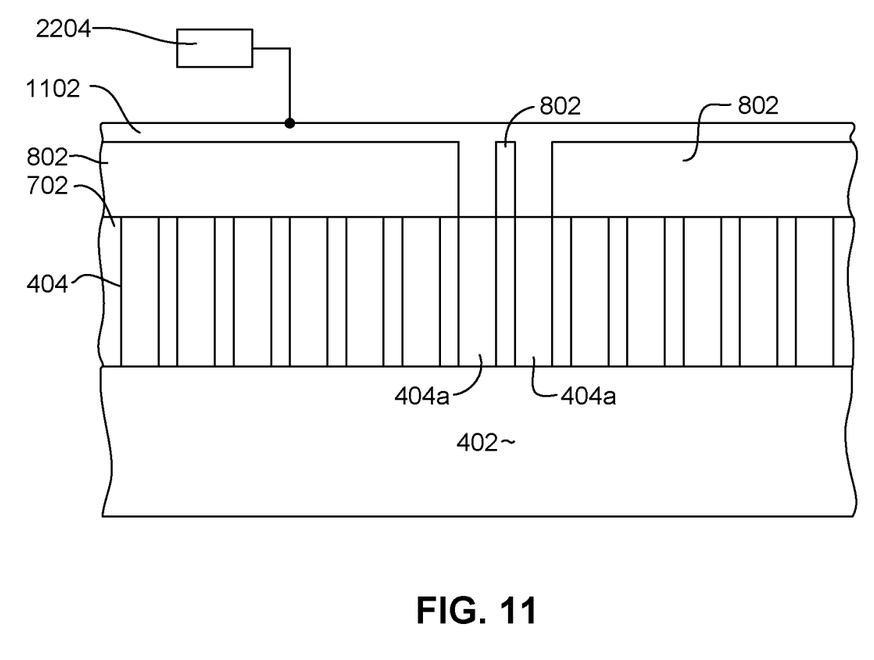

Then, with reference to FIG. 11, which shows a cross sectional view similar to FIG. 10, a layer of electrically conductive metal such as Au, Ag or Cu 1102 is deposited over the entire surface and into the openings in the photoresist mask 802. Testing circuitry 2204 can be electrically connected with the metal 1102 in order to electrically connect with the selected memory elements 404a. It can be seen that, although only the selected memory elements 404a are electrically connected with the testing circuitry, the area for making electrical connection (e.g. probing) the memory elements 404a is much larger, essentially covering the entire surface. This advantageously make it very easy to probe the individual memory elements 404a without having to physically contact individual memory elements 404a, which would be far too small to contact using standard probing/testing tooling and techniques.

The above process provides great flexibility for testing various sets of selected memory elements 404 and provides the ability to test many different sets of individual memory elements 404 before continuing further fabrication. For example, once a first individual set of memory elements 404a have been tested as described above, the metal 1102 can be removed, such as by dry or wet etching, and the photoresist mask 802 can be removed such as by a chemical liftoff process. Then, another layer of photoresist can be deposited and patterned by e-beam exposure and a new layer of electrically conductive material deposited to test a different set of individual memory elements 404. This process can be repeated as many times as necessary to test as many different combinations of memory elements as needed, with little additional expense or complexity. Once all of the desired memory elements have been tested, further fabrication processes can be continued (such as the formation of word and bit lead lines (not shown) over and contacting the memory elements 404) with the assurance that the memory elements 404 will function as desired.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for testing one or more individual magnetic memory elements in an array of magnetic memory elements, the method comprising:

forming an array of magnetic memory elements each of the magnetic memory elements being embedded in an electrically insulating material and having an end exposed through the electrically insulating material;

depositing layer of photoresist over the array of magnetic memory elements;

patterning the photoresist to form one or more openings over a selected one or more of the memory elements;

depositing an electrically conductive material over the photoresist, the electrically conductive material extending into the one or more opening in the photoresist material;

after depositing the electrically conductive material:
electrically connecting the electrically conductive layer with circuitry to test the one or more magnetic memory elements;
removing the photoresist layer and the electrically conductive material;
depositing a second layer of photoresist;
patterning the second layer of photoresist to form openings over at least one magnetic memory element that is different from the previously tested one or more magnetic memory elements; and
depositing a second layer of electrically conductive material.

2. The method as in claim 1 further comprising, after depositing the electrically conductive material, electrically connecting the electrically conductive material with circuitry configured to test the one or more magnetic memory elements.

3. The method as in claim 2, further comprising after electrically connecting the electrically conductive material with circuitry configured to test the one or more magnetic memory elements, removing the electrically conductive material and the photoresist layer.

4. The method as in claim 1, wherein the one or more openings in the photoresist are configured to expose the end of the selected one or more memory elements.

5. The method as in claim 1, wherein the patterning of the photoresist is performed by focused electron beam exposure.

6. The method as in claim 1, further comprising electrically connecting the second layer of electrically conductive material with circuitry for testing the at least one magnetic memory element that is different from the previously tested one or more previously tested memory elements.

7. The method as in claim 1, wherein the one or more magnetic memory elements comprises at least two memory element that are located adjacent to one another in the array of magnetic memory elements.

8. The method as in claim 1, wherein the magnetic memory elements in the magnetic element memory array are magnetic tunnel junction structures.

9. The method as in claim 1, wherein the magnetic memory elements are formed on a substrate having electrical circuitry embedded therein and wherein the magnetic memory elements are electrically connected with the electrical circuitry embedded in the substrate.

10. The method as in claim 1, wherein the circuitry embedded in the substrate comprises CMOS circuitry.

11. The method as in claim 1, wherein:
the magnetic memory elements are formed on a substrate that includes circuitry embedded therein, the magnetic memory elements being electrically connected with the circuitry embedded in the substrate; the method further comprising:
after depositing the electrically conductive material, electrically connecting the electrically conductive material with circuitry configured to test the one or more magnetic memory elements, the circuitry configured to test the one or more magnetic memory elements being configured to interact with the circuitry embedded in the substrate to test the magnetic memory element.

12. A method for testing a one or more individual magnetic memory elements in an array of magnetic memory elements, the method comprising:

forming an array of magnetic memory elements;

forming a mask over the array of magnetic memory elements, the mask having openings formed therein to expose ends of a selected set of magnetic memory elements of the array of magnetic memory elements;

depositing an electrically conductive material over mask and into the openings in the mask;

making electrical connection with the electrically conductive material to test the selected set of magnetic memory elements;

wherein the selected set of magnetic memory elements is a first selected set of memory elements, the method further comprising:

removing the layer of electrically conductive material and the mask;

forming a second mask over the array of magnetic memory elements, the mask having openings formed therein to expose ends of a second selected set of magnetic memory elements of the array of magnetic memory elements;

depositing a second electrically conductive material over the second mask; and making electrical connection with the second electrically conductive material to test the second selected set of magnetic memory elements.

13. The method as in claim 12, wherein the forming of the mask further comprises:

depositing a layer of photoresist; and patterning the photoresist.

14. The method as in claim 12, wherein the forming of the mask further comprises:

depositing a layer of photoresist; and patterning the photoresist using focused electron beam exposure.

15. The method as in claim 12, wherein at least one of the memory elements of the second set of magnetic memory elements is different from the memory elements of the first selected set of magnetic memory elements.

* * * * *